US011309217B2

(12) United States Patent
Li et al.

(10) Patent No.: US 11,309,217 B2
(45) Date of Patent: Apr. 19, 2022

(54) CONTACT PLUG AND METHOD OF FORMATION

(71) Applicant: TAIWAN SEMICONDUCTOR MANUFACTURING COMPANY, LTD., Hsinchu (TW)

(72) Inventors: Ya-Huei Li, Hsinchu (TW); Li-Wei Chu, Hsinchu (TW); Yu-Hsiang Liao, Hsinchu (TW); Hung-Yi Huang, Hsinchu (TW); Chih-Wei Chang, Hsinchu (TW); Ching-Hwanq Su, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/909,682

(22) Filed: Mar. 1, 2018

(65) Prior Publication Data
US 2019/0273024 A1 Sep. 5, 2019

(51) Int. Cl.
*H01L 21/768* (2006.01)
*H01L 23/522* (2006.01)
*H01L 23/528* (2006.01)
*H01L 23/532* (2006.01)
*H01L 29/66* (2006.01)
(Continued)

(52) U.S. Cl.
CPC .. *H01L 21/76897* (2013.01); *H01L 21/76802* (2013.01); *H01L 21/76831* (2013.01); *H01L 21/76846* (2013.01); *H01L 21/76883* (2013.01); *H01L 21/76889* (2013.01); *H01L 23/528* (2013.01); *H01L 23/5226* (2013.01); *H01L 23/5329* (2013.01); *H01L 23/53209* (2013.01); *H01L 23/53266* (2013.01); *H01L 21/0274* (2013.01); *H01L 21/31116* (2013.01); *H01L 21/3212* (2013.01); *H01L 21/7684* (2013.01); *H01L 29/665* (2013.01)

(58) Field of Classification Search
CPC .......... H01L 29/66545; H01L 23/5226; H01L 21/76843; H01L 21/28518; H01L 29/665; H01L 27/11582
See application file for complete search history.

(56) References Cited

U.S. PATENT DOCUMENTS 6,706,626 B2* 3/2004 Huang .............. H01L 21/76846
438/637
9,899,522 B1* 2/2018 Liu ..................... H01L 29/0847
(Continued)

*Primary Examiner* — Marcos D. Pizarro
*Assistant Examiner* — Quinton Abrasfield
(74) *Attorney, Agent, or Firm* — Birch, Stewart, Kolasch & Birch, LLP

(57) ABSTRACT

A method of making a semiconductor device that includes forming a dielectric stack over a substrate and patterning a contact region in the dielectric stack, the contact region having side portions and a bottom portion that exposes the substrate. The method also includes forming a dielectric barrier layer in the contact region to cover the side portions and forming a conductive blocking layer to cover the dielectric barrier layer, the dielectric stack, and the bottom portion of the contact region. The method can include forming a conductive layer over the conductive blocking layer and forming a conductive barrier layer over the conductive layer. The method can further include forming a silicide region in the substrate beneath the conductive layer.

20 Claims, 16 Drawing Sheets

(51) Int. Cl.
*H01L 21/027* (2006.01)
*H01L 21/311* (2006.01)
*H01L 21/321* (2006.01)

(56) References Cited

U.S. PATENT DOCUMENTS

| | | | |
|---|---|---|---|
| 2003/0057562 A1* | 3/2003 | Tsukamoto | H01L 21/76889 257/774 |
| 2004/0038517 A1* | 2/2004 | Kang | H01L 21/76802 438/630 |
| 2004/0198007 A1* | 10/2004 | Song | H01L 21/28518 438/300 |
| 2005/0023640 A1* | 2/2005 | Choi | H01L 28/91 257/532 |
| 2007/0114586 A1* | 5/2007 | Graettinger | H01L 21/76831 257/296 |
| 2008/0079090 A1* | 4/2008 | Hwang | H01L 21/76834 257/384 |
| 2009/0166866 A1* | 7/2009 | Fastow | H01L 21/76855 257/751 |
| 2011/0233503 A1* | 9/2011 | Hwang | H01L 45/126 257/2 |
| 2015/0318243 A1* | 11/2015 | Lin | H01L 21/76855 257/751 |
| 2016/0233164 A1* | 8/2016 | Choi | H01L 29/785 |
| 2017/0222014 A1* | 8/2017 | Tak | H01L 21/76897 |

* cited by examiner

CONTACT PLUG AND METHOD OF FORMATION

BACKGROUND

Semiconductor devices are widely used in various electronic equipment, such as smart phones, laptops, digital cameras, and other equipment. In general, a typical semiconductor device includes a substrate having active devices such as transistors, capacitors, inductors and other components. These active devices are initially isolated from each other, and interconnect structures are subsequently formed over the active devices to create functional circuits. Such interconnect structures may include lateral interconnections, such as metal lines (wirings), and vertical interconnections, such as conductive vias or contact plugs.

There is an ever increasing demand for smaller and faster semiconductor devices which are simultaneously able to support a greater number of increasingly complex and sophisticated functions. This scaling down process generally provides benefits by increasing production efficiency and lowering associated costs. Nevertheless, such scaling down has also increased the complexity of processing and manufacturing of the semiconductor devices. As dimensions of semiconductor devices scales to smaller sub-micron sizes in advanced technology nodes, it becomes an increasing challenge to reduce contact plug resistance while decreasing contact plug size. Improved structures and methods for manufacturing same are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
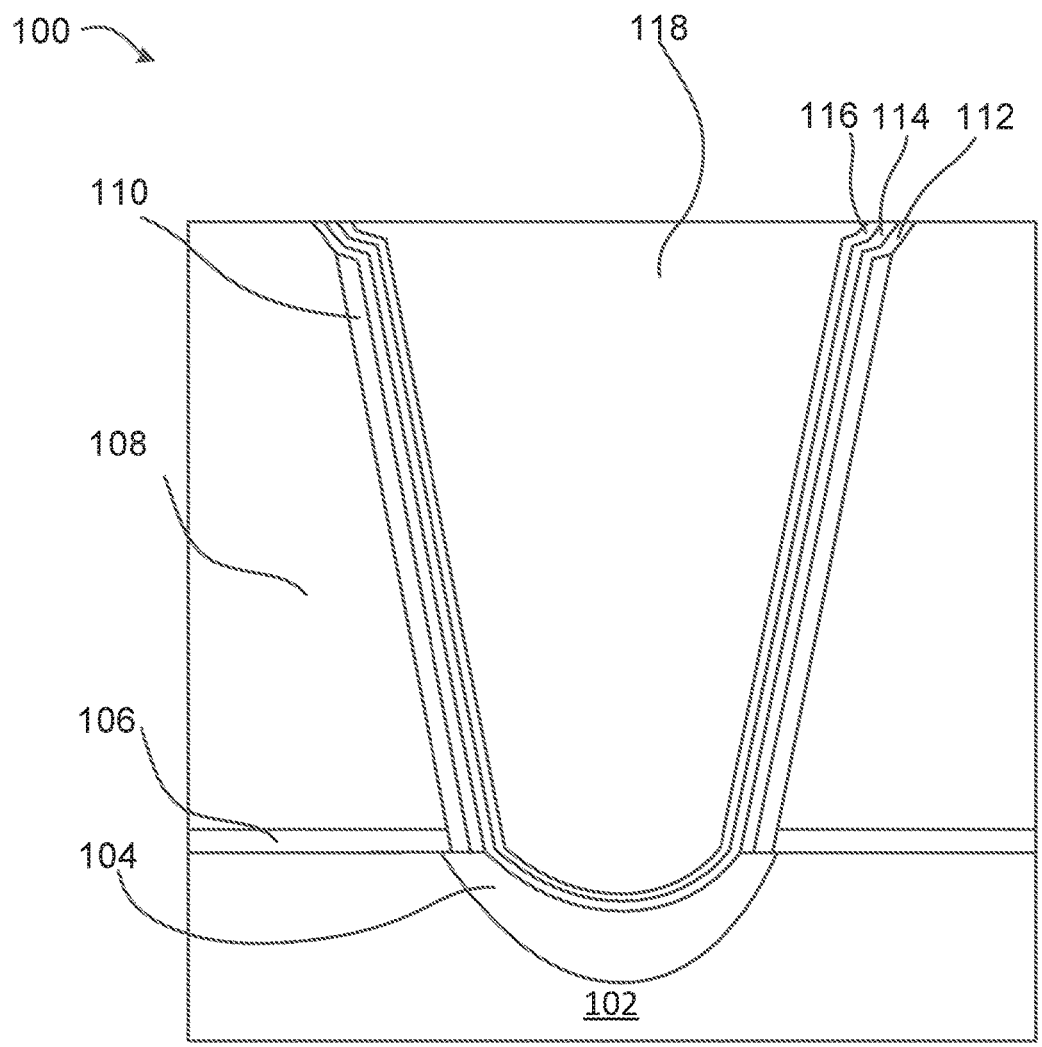
FIGS. 1A and 1B illustrate cross-sectional views of various exemplary embodiments of contact plugs.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general terms, embodiments described herein provide for a contact plug having multiple thin layers covering side portions and a bottom portion of a contact opening or contact region, and a conductive core within the contact plug that is arranged over the multiple thin layers. As semiconductor devices continue to shrink, meeting conductivity requirement as well as reliability requirement in interconnection structures of the semiconductor devices, such as contact vias or contact plugs, has become increasingly more difficult. It has been observed that such a contact plug disclosed herein may be scaled down for advanced technology node while still maintaining low resistivity and good reliability. The multiple thin layers over the side portions and the bottom portion of the contact plug acts as effectively conductive and barrier layers, while leaving sufficient spacing to allow the formation of the void-free conductive core.

Figure 1B:
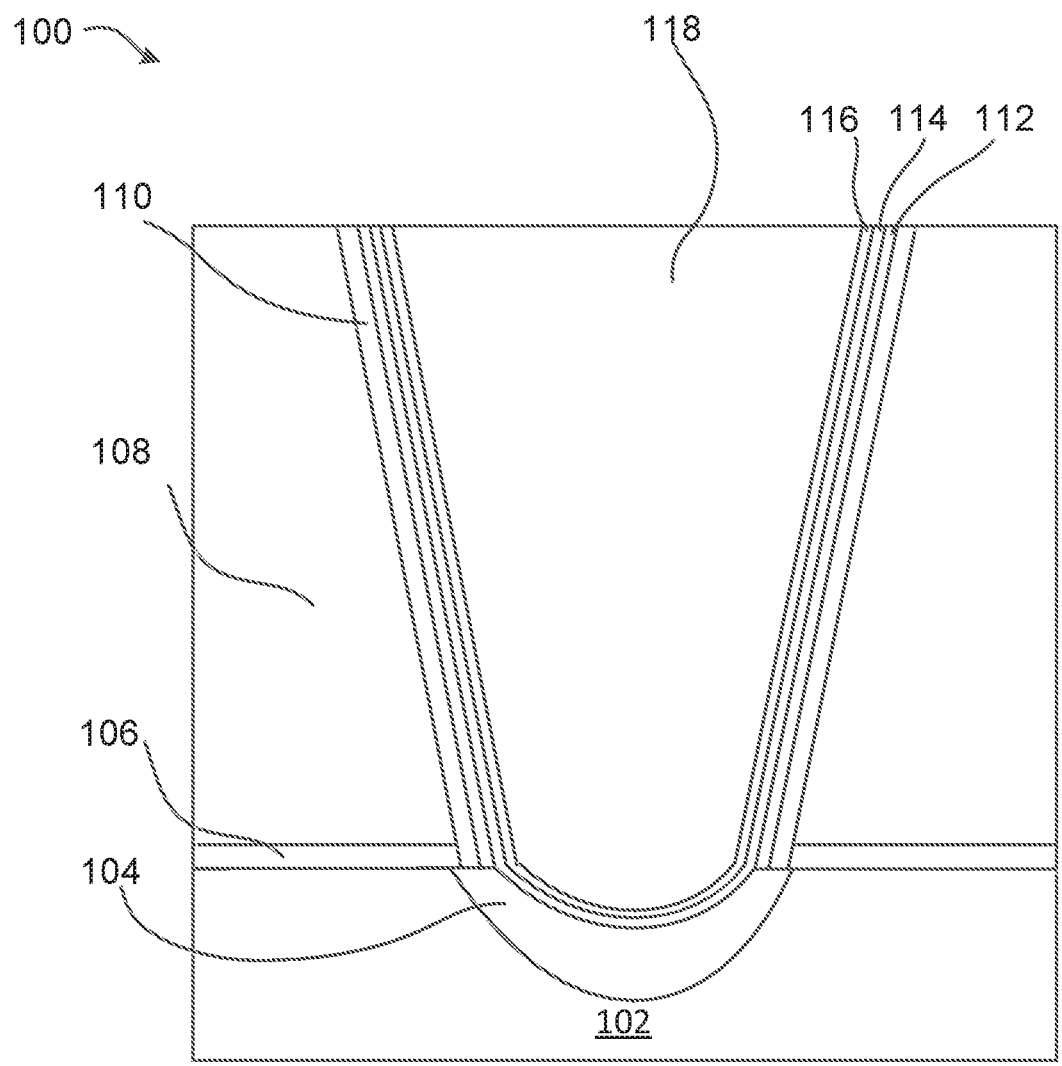

FIGS. 1A-1B show a cross-sectional view of a contact plug 100. As shown, the contact plug 100 includes a dielectric stack having dielectric layers 106 and 108 over a substrate 102. The dielectric stack can be patterned to form an opening or contact region that extends through the dielectric stack and into the substrate 102. A portion of the contact region extending into the substrate 102 can be surrounded by a silicide region 104. The contact region can extend into the substrate 102 at a varying depth, such that a middle portion extends deeper into the substrate 102 than side portions. The dielectric layer 106 may be made of SiN, SiCN, SiC, $AlO_x$, and the like, with a thickness in a range between 20 Å to 300 Å, for example. The dielectric layer 108 can be an inter-layer dielectric (ILD), an inter-metallization dielectric (IMD) layer, a low-K material layer, or the like, or a combination thereof. In the exemplary embodiment shown in FIGS. 1A-1B, the dielectric layer 106 is SiN and the dielectric layer 108 is SiOx.

The contact plug 100 can also include a dielectric barrier layer 110 that is located along side portions of the contact region. A top surface of the dielectric layer 110 can be formed to terminate below a top surface of the dielectric layer 108, as shown in FIG. 1A, or the top surface of the dielectric layer 110 can be formed level with the top surface of the dielectric layer 108, as shown in FIG. 1B, depending on design requirements. The dielectric barrier layer 110 may be made of SiN, SiCN, SiC, SiON, AlOx, or the like, and have a thickness, for example, in the range between 20 Å to 50 Å. In the exemplary embodiments of FIGS. 1A-1B, the dielectric barrier layer 110 is SiN.

The contact plug 100 can further include a conductive blocking layer 112, also referred to as a first metal layer, that is formed over the dielectric barrier layer 110 in the opening or contact region to cover the side portions of the contact region. The conductive blocking layer 112 is formed at a low temperature, such as a temperature less than 30° C., for example between 25° C. and 30° C. The thickness of the conductive blocking layer 112 may, for example, be less than 10 Å depending on the technology requirements. The conductive blocking layer 112 can be made of titanium (Ti), nickel (Ni), tungsten (W), cobalt (Co), platinum (Pt) and the like. In the exemplary embodiments of FIGS. 1A-1B, the conductive blocking layer 112 is Ti.

A conductive layer 114, also referred to as a second metal layer, can be formed over the conductive blocking layer 112, covering the side portions and bottom portion of the contact region. As shown in FIGS. 1A-1B, the conductive layer 114 can extend into the substrate 102 and be in direct contact with the silicide region 104. The conductive layer 114 can be made of titanium (Ti), nickel (Ni), tungsten (W), cobalt (Co), platinum (Pt) or the like, and have a thickness, for example, less than 10 Å on the side portions of the opening and a thickness in the range, for example, between 20 Å and 30 Å on the bottom portion of the opening. In the exemplary embodiments of FIGS. 1A-1B, the conductive layer 114 is Ti.

Further, a conductive barrier layer 116 can be formed over the conductive layer 114 in the contact region. The conductive barrier layer 116 can function as both a barrier layer and an adhesion layer to conductive core 118, wherein the conductive barrier layer 116 prevents or reduces the reflow/diffusion of the conductive core 118 to the surrounding layers, and promotes the adhesion of the conductive core 118 to the surrounding layers as well. In exemplary embodiments, the conductive barrier layer 116 may be made of Ta, Ti, TiN, TaN, or the like, with a thickness, for example, less than 10 Å.

As shown in FIGS. 1A-1B, a conductive core 118 is formed in the contact region and in contact with the conductive barrier layer 116. In order to provide spacing for the formation of the conductive core 118, a combined thickness of layers 112, 114 and 116 on the side portions of the contact region can be less than 20 Å. The conductive core 118 makes electrical contact with the silicide region 104, such as a silicided source/drain region or a silicided gate electrode, through the conductive barrier layer 116 and the conductive layer 114. The conductive core 118 can be made of cobalt (Co), tungsten (W), ruthenium (Ru), copper (Cu), aluminum (Al), and the like.

In the exemplary embodiment of FIGS. 1A-1B, the silicide region 104 is a self-aligned silicide (silicide) that can be formed by annealing the conductive blocking layer 112 and the conductive layer 114. The silicide region 104 can be formed beneath the conductive layer 114 and extend into the substrate 102 with a varying depth from about 20 Å to about 200 Å. In general, a depth of the silicide region 104 can be smaller at end portions relative to a larger depth at a middle portion. The silicide region 104 can also extend laterally and be formed under the dielectric barrier layer 110 and dielectric stack. The silicide region 104 can provide a good ohmic contact between the substrate 102 and the contact plug 100, and therefore can improve the conductivity of semiconductor device. In some embodiments, the silicide region 104 includes $TiSi_x$, $NiSi_x$, $WSi_x$, $CoSi_x$, $PtSi_x$, and the like. The underlying silicided structure (e.g., the substrate 102) can include silicon (Si), silicon germanium (SiGe), silicon phosphorous (SiP), silicon carbide (SiC), and the like.

The contact plug 100 can meet both conductivity and reliability requirements as semiconductor devices scale down to advanced technology node, such as 10 nm node and beyond. In conventional technology, the conductive layer 114 may be in direct contact with the dielectric stack (having layers 106 and 108) and the dielectric barrier layer 110. During formation of the conductive layer 114, a reaction may occur between the dielectric barrier layer 110/dielectric stack (having layers 106 and 108) and the forming gases that produce the conductive layer 114. A by-product of the reaction can remain on the side portions and the bottom portion of the opening. As a result, a spacing to form the conductive core 118 can be reduced. When the dielectric barrier layer 110 is silicon nitride (SiN) and the conductive layer 114 is titanium (Ti), an example of the by-product of the reaction can be TiSiN. As a consequence of the reduced spacing, the conductive core 118 can be deformed, for example, as a voided or incomplete conductive core 118 which may cause both electrical failure and reliability failure.

By forming a thin and low-temperature conductive blocking layer 112 in the opening or contact region prior to the formation of the conductive layer 114, the reaction between the dielectric barrier layer 110/dielectric stack (having layers 106 and 108) and the conductive layer 114 can be reduced or prevented. In particular, by forming the conductive blocking layer 112 at a low temperature, such as a temperature less than 30° C., for example, between 25° C. and 30° C., reaction between the conductive blocking layer 112 and the dielectric barrier layer 110 or between conductive blocking layer 112 and the dielectric stack (having layers 106 and 108) can be minimized.

In addition, in the contact plug 100 disclosed herein, a dielectric barrier layer 110 is formed on the side portions of the opening or contact region. The dielectric barrier layer 110 can act as an effective diffusion barrier to prevent the electrical short from the adjacent contacts or components, and hence can improve both the electrical and reliability properties of the contact plug 100.

Moreover, both the conductive blocking layer 112 and the conductive layer 114 can help the formation of the silicide region 104. The silicide region 104 can reduce the resistance and help the formation of an ohmic contact between the contact plug 100 and the substrate 102.

Further, in the contact plug 100 disclosed herein, a combined thickness of layers 112, 114 and 116 on the side portions of the contact region are well controlled to provide sufficient spacing for the formation of a void-free conductive core 118. In the embodiment of FIGS. 1A-1B, the combined thickness of layers 112, 114 and 116 on the side portions of the contact region are less than 20 Å.

In FIGS. 2 through 13, an exemplary technique of manufacturing the contact plug 100 will be described with reference to schematic cross-sectional views of a contact plug at intermediary steps of manufacturing. Beginning with FIG. 2, a dielectric film stack can be formed on a substrate 102. The substrate 102 may be a portion of the source or drain of Fin Field-Effect Transistor (FinFET), a portion of the source or drain of metal-oxide-semiconductor field-effect transistors (MOSFETs), or a portion of the gate electrode of FinFET/MOSFETs, which includes silicon (Si), germanium (Ge), silicon carbide (SiC), silicon germanium (SiGe), silicon phosphorous (SiP), and the like.

Figure 2:
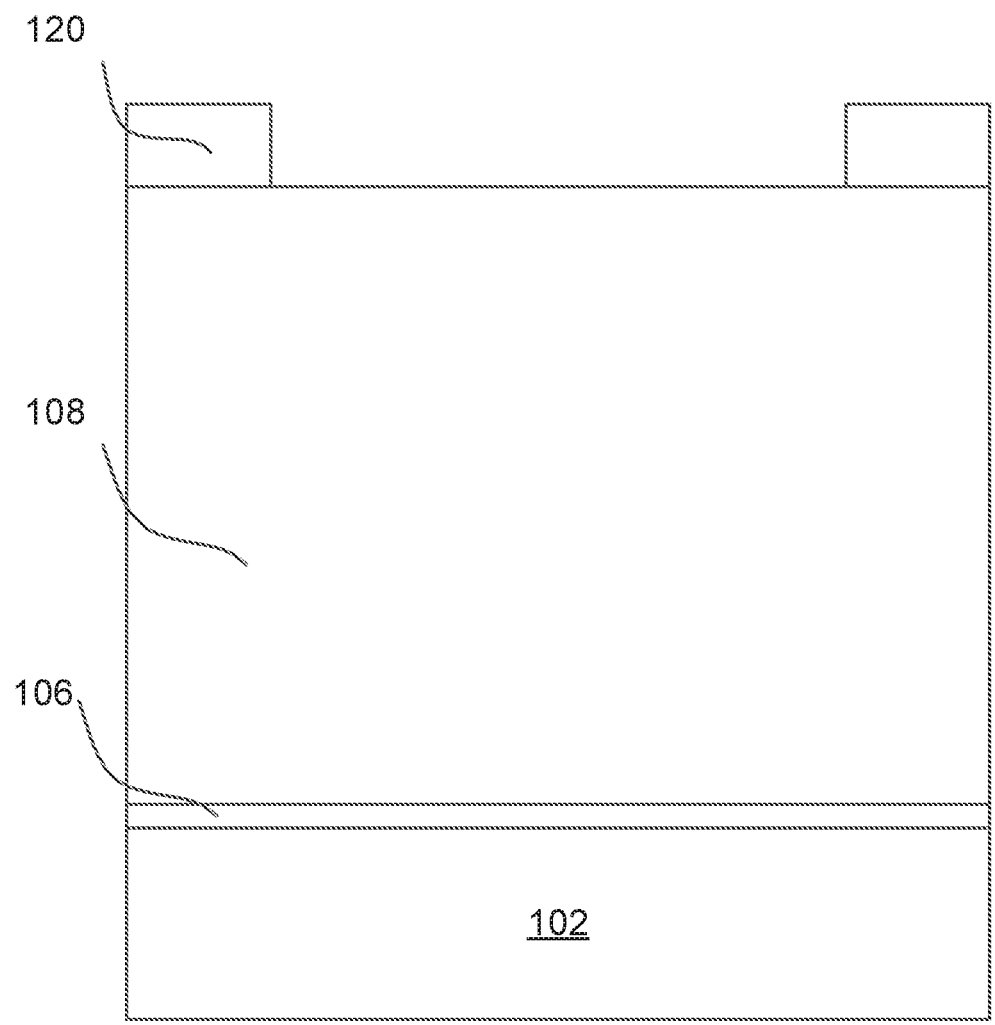
FIGS. 2 through 13 illustrate exemplary schematic cross-sectional views of various intermediary steps of manufacturing a contact plug in accordance with some embodiments.

As further illustrated by FIG. 2, a dielectric layer 106 is formed over the substrate 102. In some embodiments, the dielectric layer 106 has a thickness that can vary with the applied technology, for example, a thickness of about 20 Å to about 300 Å. In some embodiments, the dielectric layer 106 is SiN, SiCN, SiC, AlOx, or the like, or a combination thereof. The dielectric layer 106 can deposited through any of a variety techniques, such as chemical vapor deposition (CVD), physical vapor deposition (PVD), atomic layer deposition (ALD), e-beam evaporation, and the like.

Another dielectric layer 108 can be deposited over the dielectric layer 106. In various embodiments, dielectric layer 108 may be a first inter-layer dielectric (ILD) or an inter-metallization dielectric (IMD) layer. The dielectric layer 108 may be formed, for example, of a low-k dielectric material having a k value less than about 4.0 or even about 2.8. The dielectric layer 108 may be phosphosilicate glass (PSG), borophosphosilicate glass (BPSG), FSG (SiOF series material), SiOxCy, Spin-On-Glass, Spin-On-Polymers, silicon carbon material, compounds thereof, and the like. The dielectric layer 108 can deposited through by any suitable method, such as atomic layer deposition (ALD), physical vapor deposition (PVD), liquid source misted chemical deposition (LSMCD), spinning, chemical vapor deposition (CVD), coating or any another process that is adapted to form a thin film layer over the substrate. Dielectric layer 108 may also include multiple layers, such as isolation layers, glue layers, buffer layers, and the like. The thickness of the dielectric layer 108 varies with the applied technology and can range, for example, from 1000 Å to about 30000 Å.

As shown in FIG. 2, a patterned photoresist 120 can also be form over the dielectric layer 108. Of course the photoresist 120 can be pattern according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like. In some embodiments, the photoresist 120 can be a layer of photosensitive polymer used to transfer pattern from mask (not shown herein) to underlying substrate. In some embodiments, the photoresist 120 could include multiple layers, such as underlayer, hardmask, bottom anti-reflective coatings (BARC), and other suitable materials according to the technology requirement.

Figure 3:
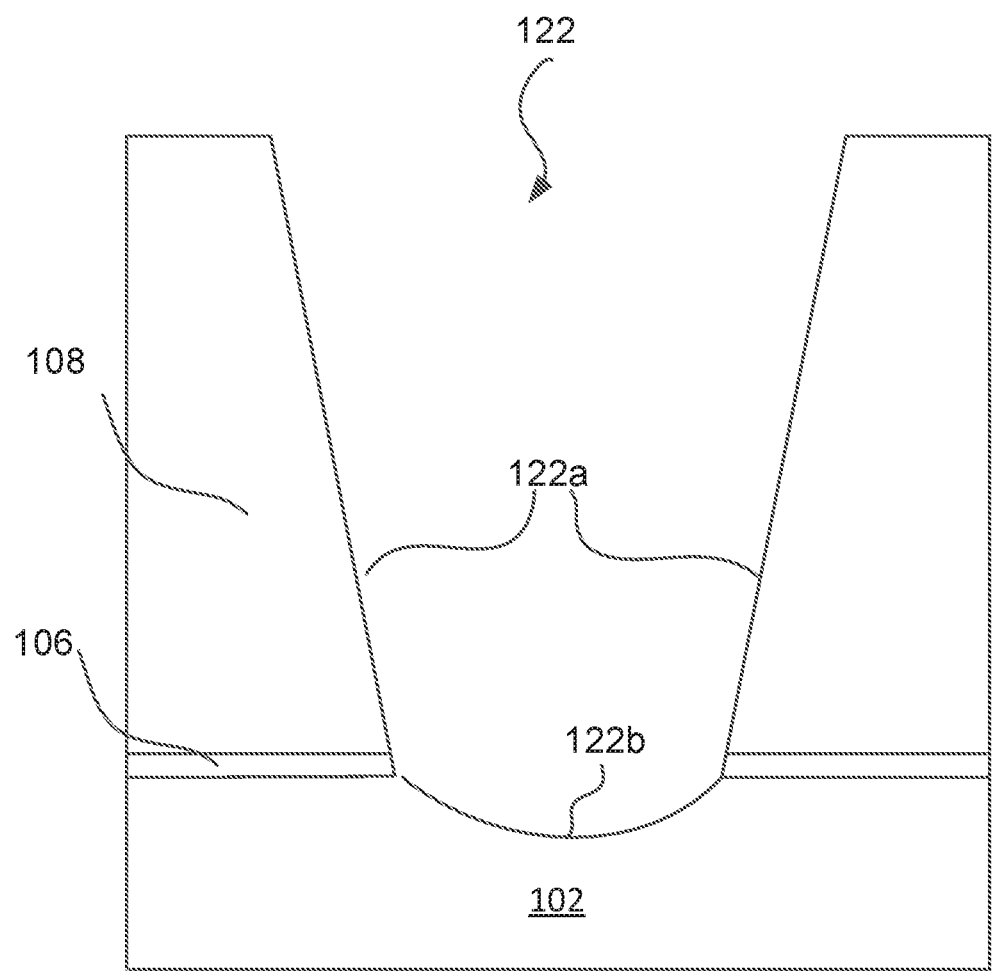

In FIG. 3, an opening or contact region 122 is formed in the dielectric stack, including the dielectric layers 106 and 108, through an etching process. The opening or contact region 122 has side portions 122a and a bottom portion 122b that exposes the substrate 102. The contact region 122 can extend into the substrate 102 at a varying depth. In general, a depth of the opening can be smaller at the end portions relative to a larger depth at a middle portion of the opening. Any suitable technique can be used to etch the opening or contact region 122, for example, in some embodiments the etching process may include dry etching (e.g., RIE or ICP etching), wet etching, and/or other etching methods. The etching process is used to etch portions of the dielectric layers 106 and 108, and expose the substrate 102 via the opening or contact region 122. The opening or contact region 122 may expose a region of the underlying substrate 102, such as a source/drain region, a gate electrode, a Si substrate, or the other components of a semiconductor device. Subsequently, the remaining photoresist 120 can be removed by, for example, a plasma ashing and/or wet clean processes. Although only one opening or contact region 122 is shown, of course any number of openings or contact regions may be patterned over the substrate 102, through dielectric layers 106 and 108, depending on device design.

In some embodiments, other layers may be used in the patterning process. For example, one or more hard masks (not shown) might be formed above the dielectric layer 108 prior to formation of photoresist 120, in which embodiments the pattern from photoresist 120 would first be imposed upon the one or more hard masks and the patterned hard masks would be used in patterning dielectric layers 106 and 108 afterward. Generally, one or more hard mask layers may be useful in embodiments in which the etching process requires masking in addition to the masking provided by the photoresist material. During a subsequent etching process to pattern dielectric layers 106 and 108, the patterned photoresist mask will also be etched, although the etch rate of the photoresist material may not be as high as the etch rate of dielectric layers 106 and 108. If the etch process is such that the patterned photoresist mask may be consumed prior to completing the etching process on dielectric layers 106 and 108, then an additional hard mask may be utilized. The material of the hard mask layer or layers is selected such that the hard mask layer(s) exhibit a good deposition uniformity and lower etch rate than the underlying materials, such as the materials of the dielectric layers 106 and 108. In some embodiments, the hard mask layers are silicon oxynitride (SiON), TiN, spin on hardmask (SOH), silicon nitride (SiN), silicon carbide (SiC), silicon oxide ($SiO_2$), or a combination thereof.

Figure 4:
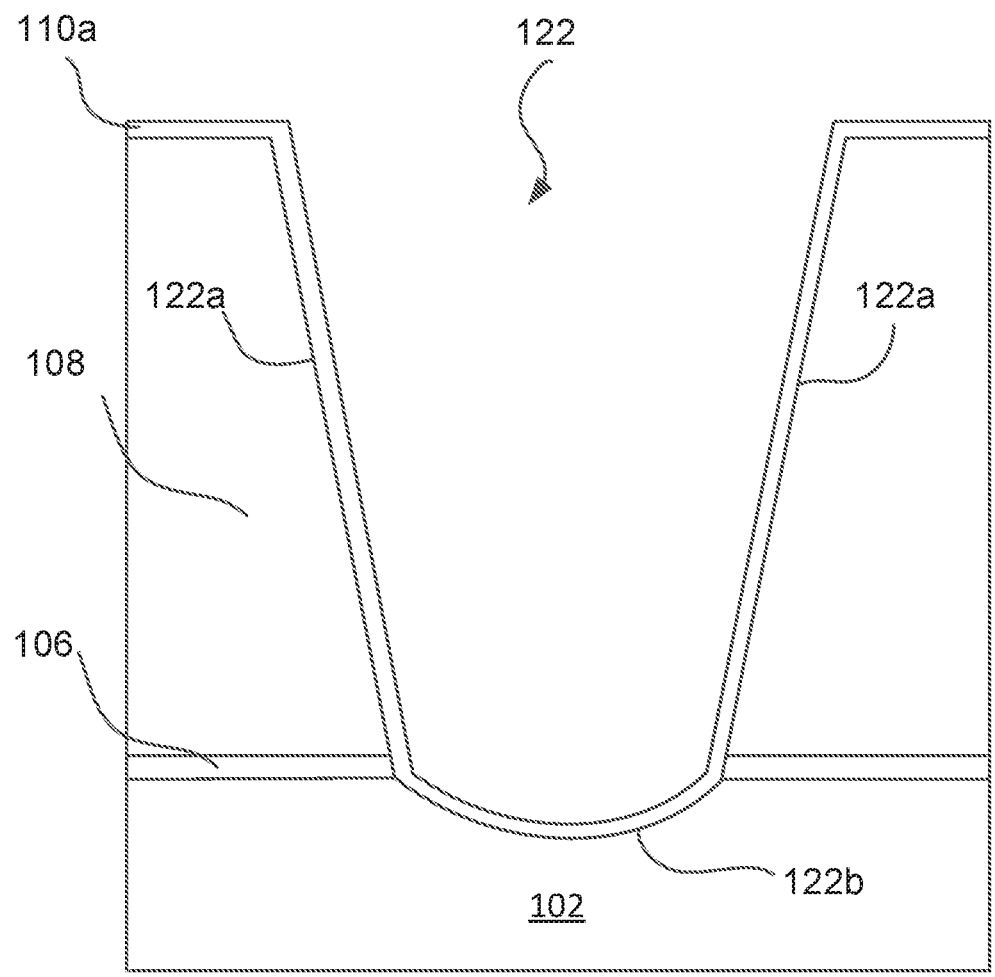

In FIG. 4, a dielectric barrier layer 110a is deposited in the opening or contact region 122 to cover the side portions 122a and bottom portion 122b. In some embodiments, the dielectric barrier layer 110a may be SiN, SiCN, SiC, SiON, $AlO_x$, or the like, or the combination thereof. In various embodiments, the dielectric layer 110a may be deposited by any suitable deposition process, such as chemical vapor deposition (CVD), physical vapor deposition (PVD), atomic layer deposition (ALD), e-beam evaporation, or any combination thereof. As semiconductor devices keep shrinking, the spacing between two contacts or between the contact and the adjacent components can be reduced correspondingly. The reduced spacing could result in electrical shorts as well as reliability failures. The dielectric barrier layer 110a disclosed herein serves as a diffusion barrier layer to prevent electrical shorts and the reliability failures, such as the TDDB (Time-dependent dielectric breakdown).

Figure 5:
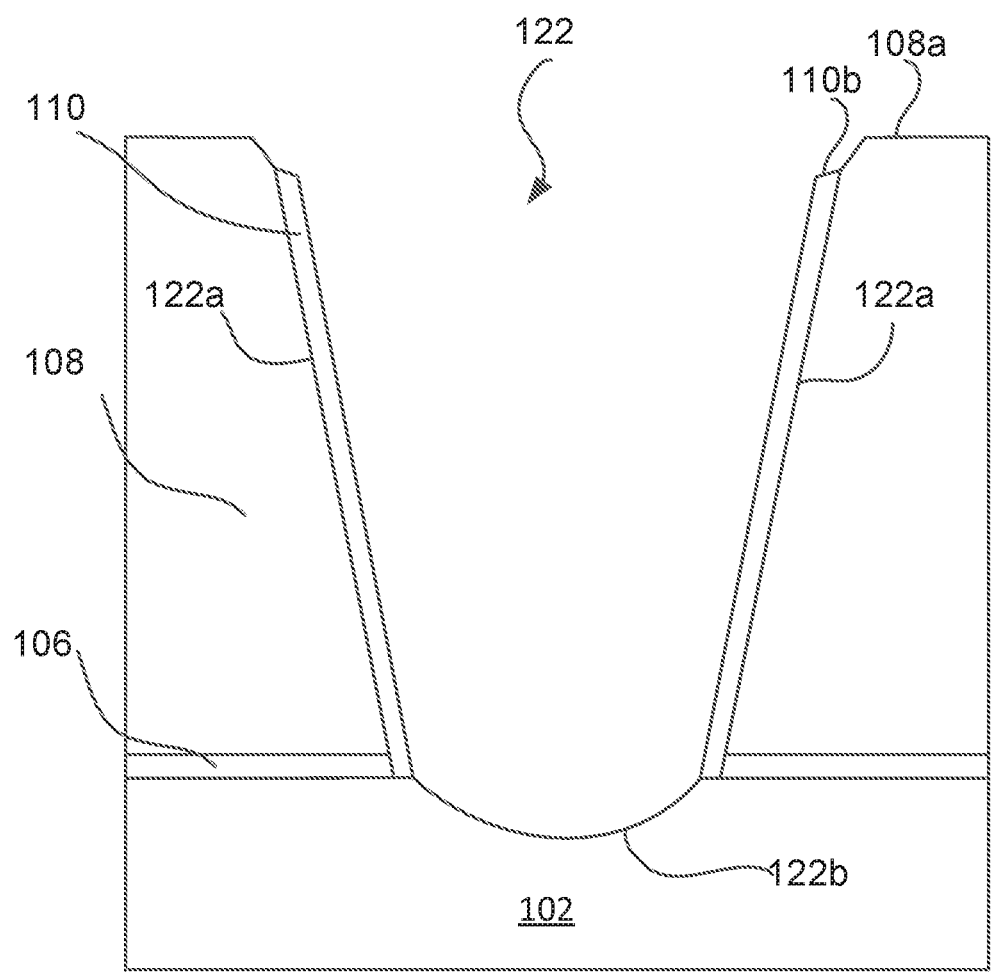

In FIG. 5, the dielectric barrier layer 110a can be etched to expose the substrate 102. In some embodiments, the etching process may include blanket dry etching (e.g., blanket RIE or ICP etching). Blanket etch herein can mean a etch process without any mask to protect a portion of the contact plug 100. In some embodiments, as desired a mask could be applied to expose the bottom portion of the dielectric barrier layer 110a only. During the dry etching, a directional plasma or anisotropic plasma can be generated to remove a bottom portion of the dielectric barrier layer 110a. As shown, during the removal the bottom portion of the dielectric barrier layer 110a, a top portion of the dielectric barrier layer 110a over the dielectric layer 108, and a top portion of the dielectric layer 108 adjacent to the opening 122 are removed as well.

As a result of the etching process, the dielectric barrier layer 110a becomes dielectric barrier layer 110 covering side portions 122a of the contact region 122 only, and a top surface 110b of the dielectric barrier layer 110 can be lower than a top surface 108a of the dielectric layer 108. In an embodiment as shown in FIG. 5, the dielectric barrier layer 110 can remain on the side portions 122a of the contact region 122, and the dielectric barrier layer 110 is direct contact with the dielectric layers 106 and 108, and the substrate 102. In another embodiment, the dielectric barrier layer 110 remains only on part of the side portions 122a of the contact region 122, and the dielectric barrier layer 110 may not be in contact with the dielectric layer 106 and the substrate 102, depending on the etching process. Regardless, the final dielectric barrier layer 110 can serve as an effective barrier layer to prevent the electrical short and reliability failure between two adjacent contact plugs or between a contact plug and the adjacent components in the semiconductor devices. The dielectric barrier layer 110 may be SiN, SiCN, SiC, SiON, $AlO_x$, and the like, with a thickness, for example, in the range between 20 Å to 50 Å.

Figure 6:
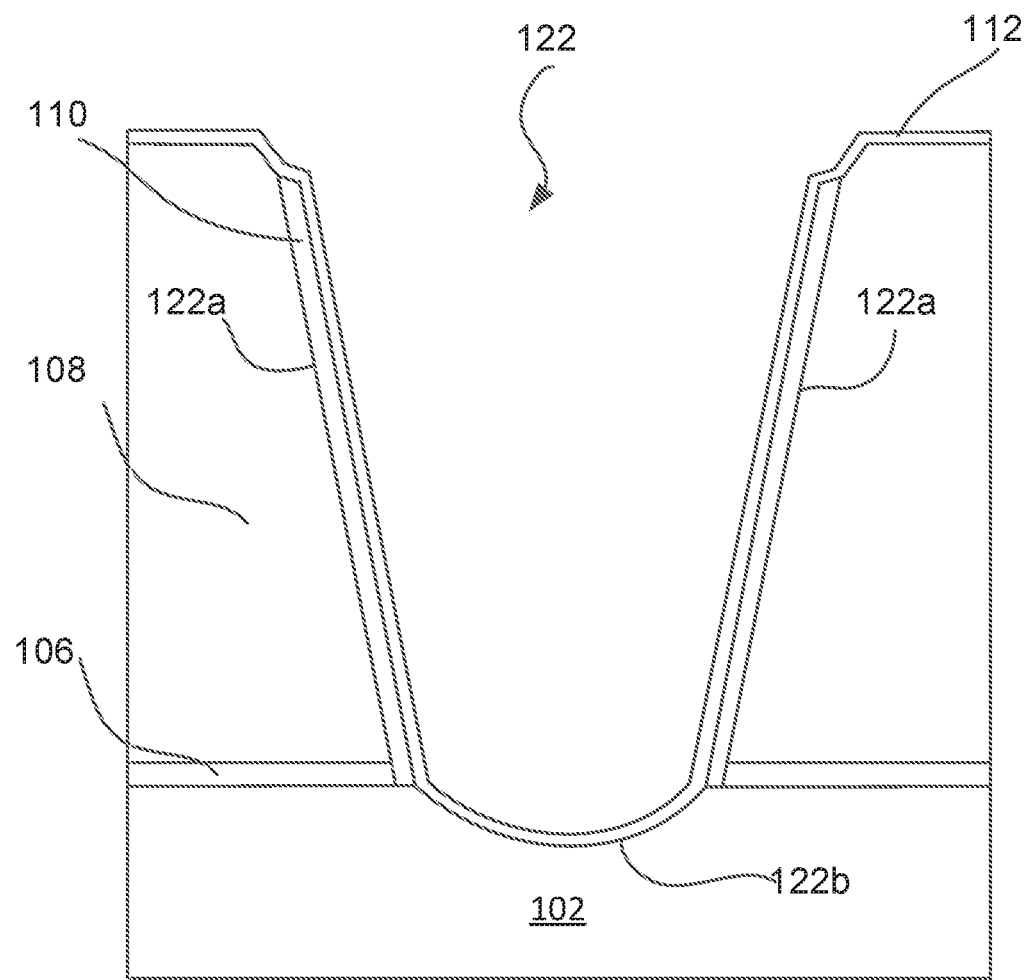

In FIG. 6, a conductive blocking layer 112 is formed in the contact region 122 over the side portions 122*a* and bottom portion 122*b* of the opening 122, as well as over the exposed substrate 102. As shown, the conductive blocking layer 112 can also be formed over the dielectric barrier layer 110 and extend into the substrate 102. The conductive blocking layer 112 can be thin and have a thickness, for example, less than 10 Å. The conductive blocking layer 112 can be formed by a low temperature process, such as a temperature less than 30° C., for example between 25° C. and 30° C. Many techniques can be used to form the thin and low-temperature formed conductive blocking layer 112 including: physical vapor deposition (PVD), sputtering, chemical vapor deposition (CVD), atomic layer deposition (ALD), or other feasible low-temperature deposition techniques. The conductive blocking layer 112 may be titanium (Ti), nickel (Ni), tungsten (W), cobalt (Co), platinum (Pt), and the like. As mentioned above, a thin, low-temperature formed conductive blocking layer 112 disclosed herein acts as an effective blocking layer to prevent the reaction between the dielectric barrier layer 110/dielectric stack (having layers 106 and 108) and the subsequent conductive layer 114. The conductive blocking layer 112 can also assist in forming the silicide region which can subsequently be formed during an annealing process.

Figure 7:
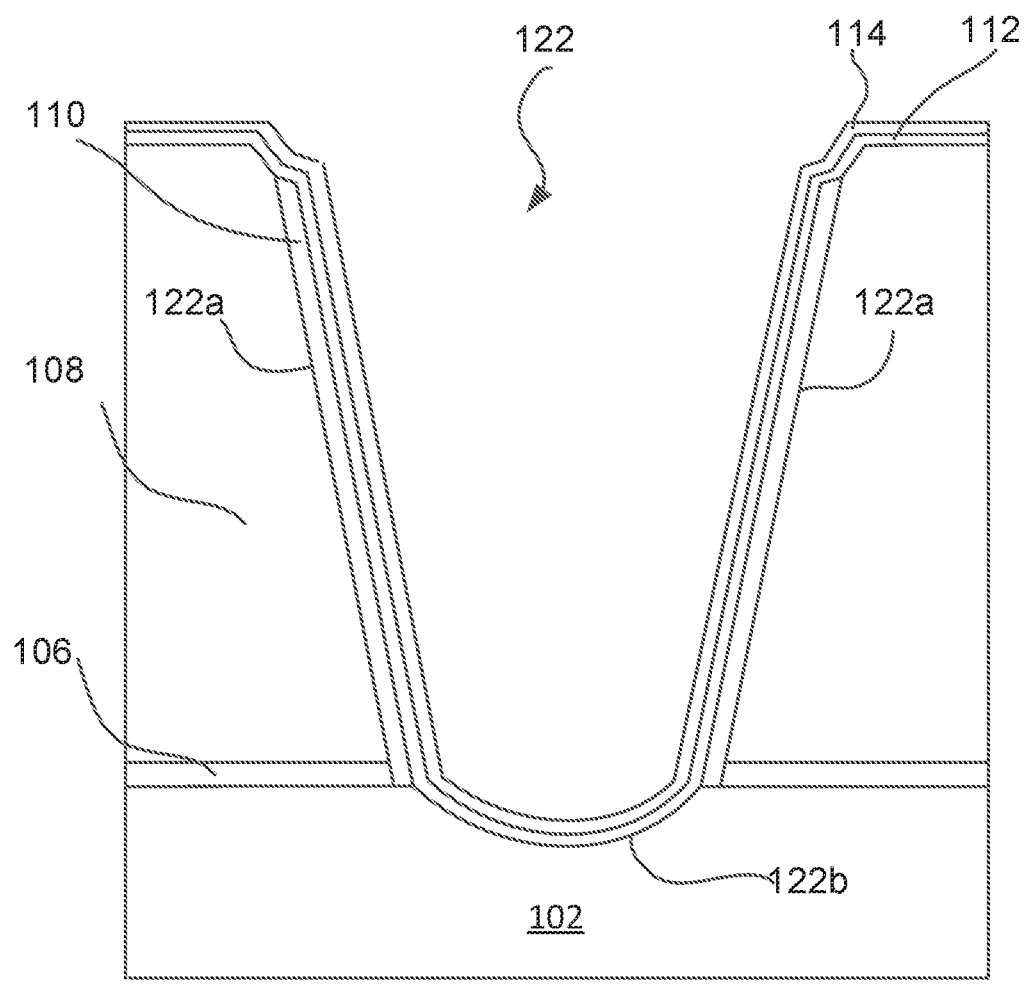

In FIG. 7, a conductive layer 114 is formed in the opening or contact region 122 over the conductive blocking layer 112, covering the side portions 122*a* and bottom portion 122*b* of the contact region 122. The conductive layer 114 can assist in forming the silicide region 104 which will subsequently be formed and acts as a layer to reduce the resistance and help the formation of an ohmic contact between the contact plug 100 and the substrate 102. In an embodiment, the conductive layer 114 can have a thickness less than 10 Å on the side portion 122*a* and a thickness in the range between 20 Å and 30 Å on the bottom 122*b* portion. The conductive layer 114 can be deposited by physical vapor deposition (PVD), chemical vapor deposition (CVD), plasma-enhanced CVD (PECVD), low pressure CVD (LPCVD), atomic layer deposition (ALD), sputtering, and other well-known deposition techniques. The conductive layer 114 may be titanium (Ti), nickel (Ni), tungsten (W), cobalt (Co), platinum (Pt), and the like.

Figure 8:
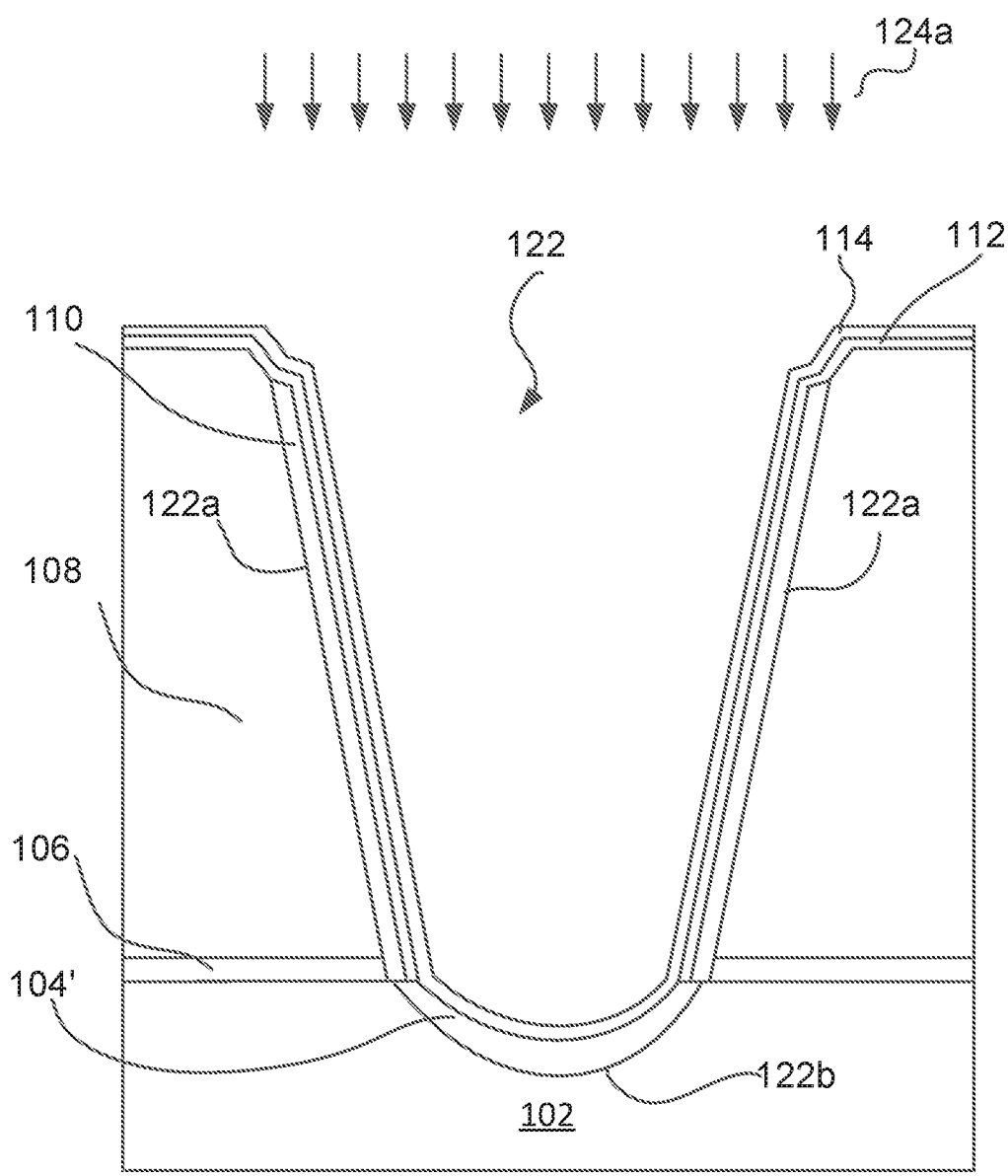

As shown in FIG. 8, a first annealing process 124*a* can be performed to form a silicide region 104'. The silicide region 104' may be formed by diffusing the conductive material of conductive blocking layer 112 into upper portions of substrate 102. For example, an annealing process may be performed at a temperature of about 100° C. to about 900° C. using argon (Ar) or nitrogen ($N_2$) as a process gas under an atmosphere pressure of about 770 Torr to about 850 Torr. After annealing, bottom portion of the conductive blocking layer 112 that is in direct contact with the substrate 102 may be diffused into substrate 102 and transformed into silicide while side portions of the conductive blocking layer 112 over dielectric barrier layer 110 may remain. In addition, the conductive layer 114 can still remain. The silicide 104' can include $TiSi_x$, $NiSi_x$, $WSi_x$, $CoSi_x$, $PtSi_x$, and the like, depending on the material type of the conductive blocking layer 112.

Figure 9:
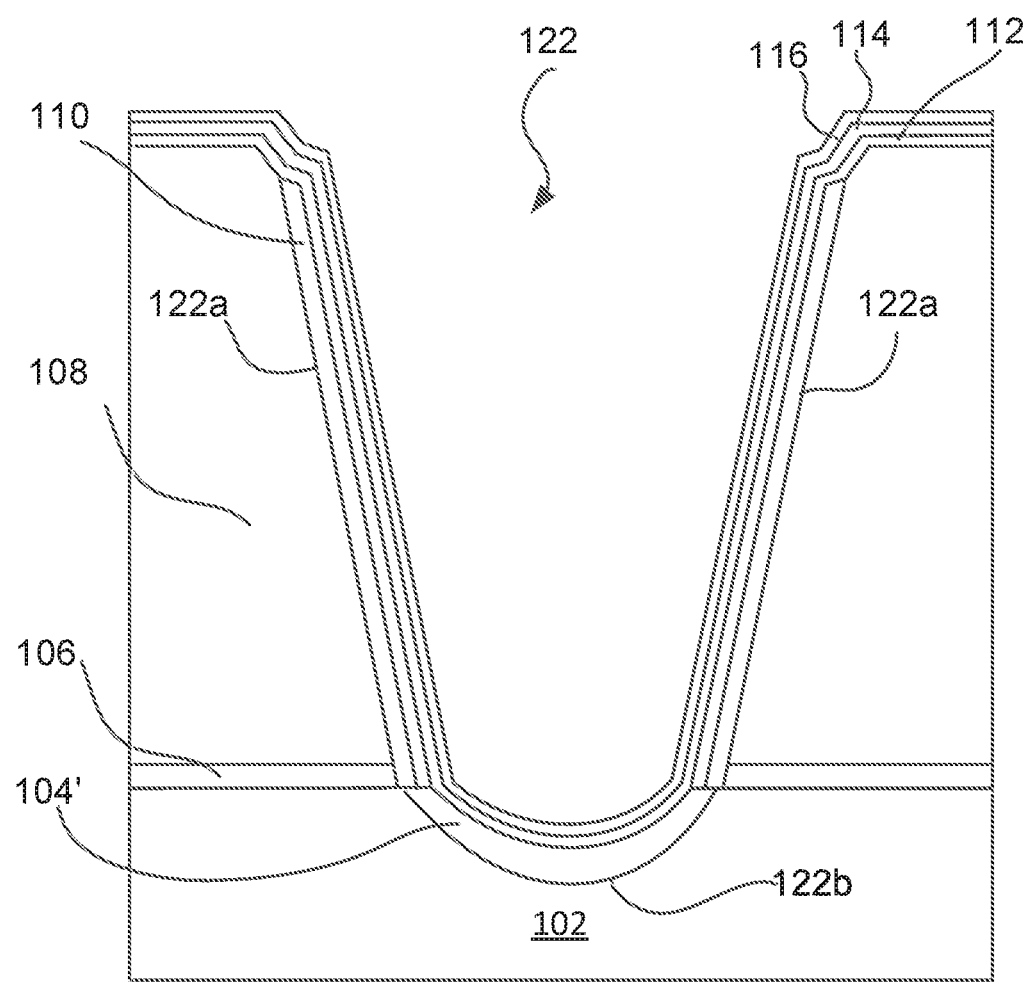

In FIG. 9, a conductive barrier layer 116 is formed over the conductive layer 114, along the side portions 122*a* and bottom portion 122*b* of the opening or contact region 122. The conductive barrier layer 116 disclosed herein can be formed to promote the adhesion of the conductive core 118 to the surrounding layers in the opening or contact region 122. The conductive barrier layer 116 can also function as a barrier layer to prevent the conductive core 118 from reflow/diffusion into the surrounding layers that the conductive core 118 is in contact with. In various embodiments, the conductive barrier layer 116 may include Ta, Ti, TiN, TaN, and the like, and be deposited by a suitable deposition process, such as chemical vapor deposition (CVD), physical vapor deposition (PVD), atomic layer deposition (ALD), sputtering, e-beam evaporation, or any combination thereof. The thickness of the conductive barrier layer 118 can be less than 10 Å. It should be noted that the total thickness of layers 112, 114 and 116 along the side portions of the contact region can be less than 20 Å in order to provide spacing for the formation of a conductive core 118 in the opening or contact region.

Figure 10:
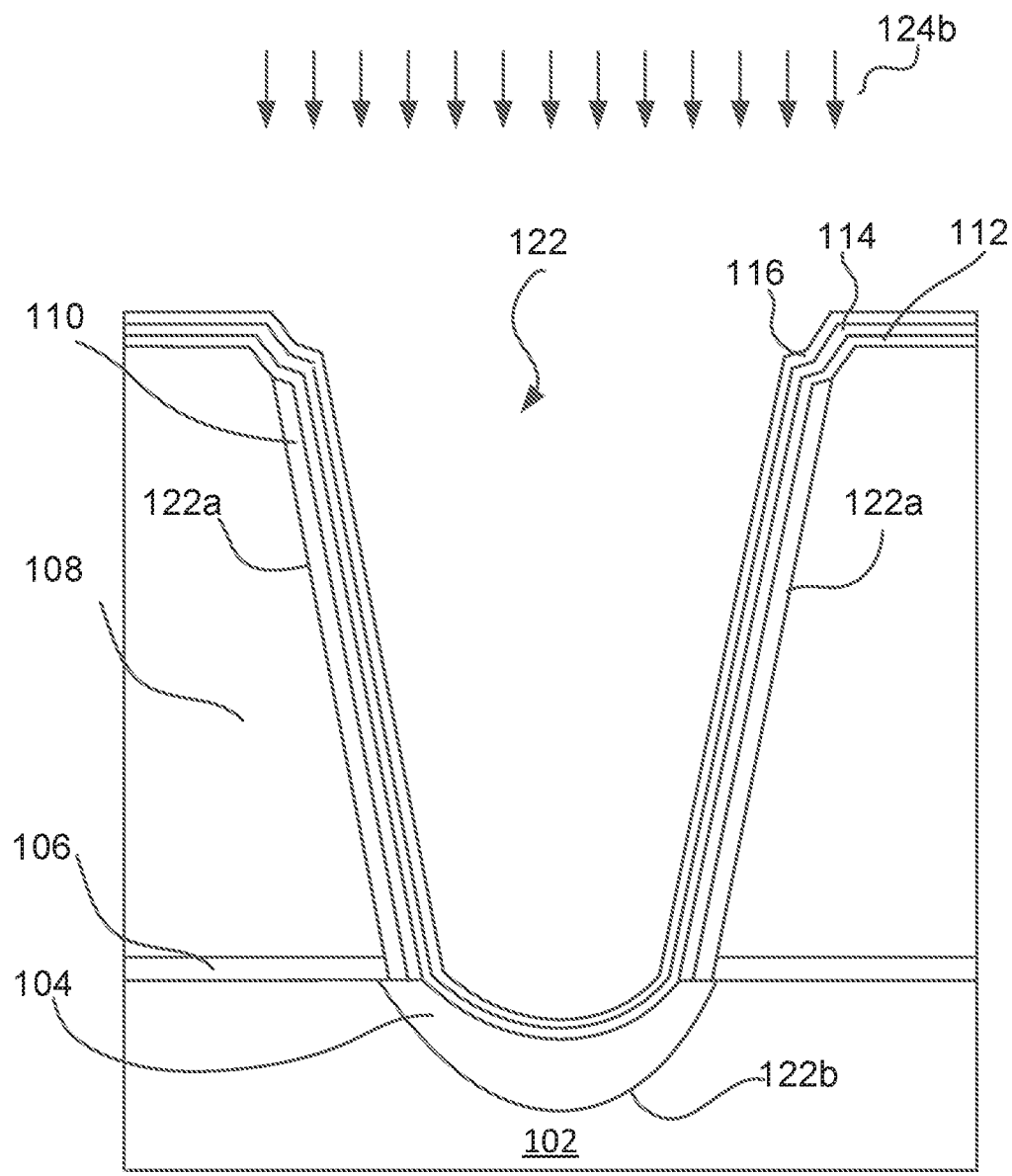

Shown in FIG. 10, after the formation of the conductive barrier layer 116, a second annealing process 124*b* can be performed to expand the silicide region 104' into the substrate 102 beneath the bottom portion 122*b* of the opening or contact region 122. The second annealing process 124*b* may be performed at a temperature of about 100° C. to about 900° C. using argon (Ar) or nitrogen ($N_2$) as a process gas under an atmosphere pressure of about 770 Torr to about 850 Torr. After annealing, part of a bottom portion of the conductive layer 114 may be diffused into substrate 102 and transformed into silicide, while portions of conductive layer 114 over the conductive blocking layer 112 along side portions 122*a* of opening 122 may remain. The conductive blocking layer 112 and the conductive barrier layer 116 can remain after the second annealing process 124*b*. Thermal energy provided by the second annealing process 124*b* further diffuse the conductive material originally in silicide 104' and conductive material from layer 114 into the substrate 102 in both vertical and lateral directions. After the second annealing process 124*b* is completed, the initial silicide region 104' becomes silicide region 104 with an expanded profile shown in FIG. 10. As shown, the silicide region 104 can be formed beneath the conductive layer 114 and extend vertically into the substrate 102 with a varying depth from about 20 Å to about 200 Å depending on design. In general, a depth of the silicide region 104 can be smaller at the end portions relative to a larger depth at a middle portion. The silicide region 104 can also extend laterally into the substrate 102 and be formed under the dielectric barrier layer 110 and dielectric stack. The silicide 104 can include $TiSi_x$, $NiSi_x$, $WSi_x$, $CoSi_x$, $PtSi_x$, or the like, depending on the material type of the conductive blocking layer 112 and the conductive layer 114.

As the semiconductor device sizes continue to shrink, the critical dimension (CD) of the contact plug can also reduce correspondingly. The smaller CD will increase the resistance of the contact plug and new structure design can be needed to reduce the resistivity. A silicide region 104 formed herein can provide a good ohmic contact between the substrate 102 and the contact plug 100, and therefore improve the conductivity of semiconductor device.

Figure 11:
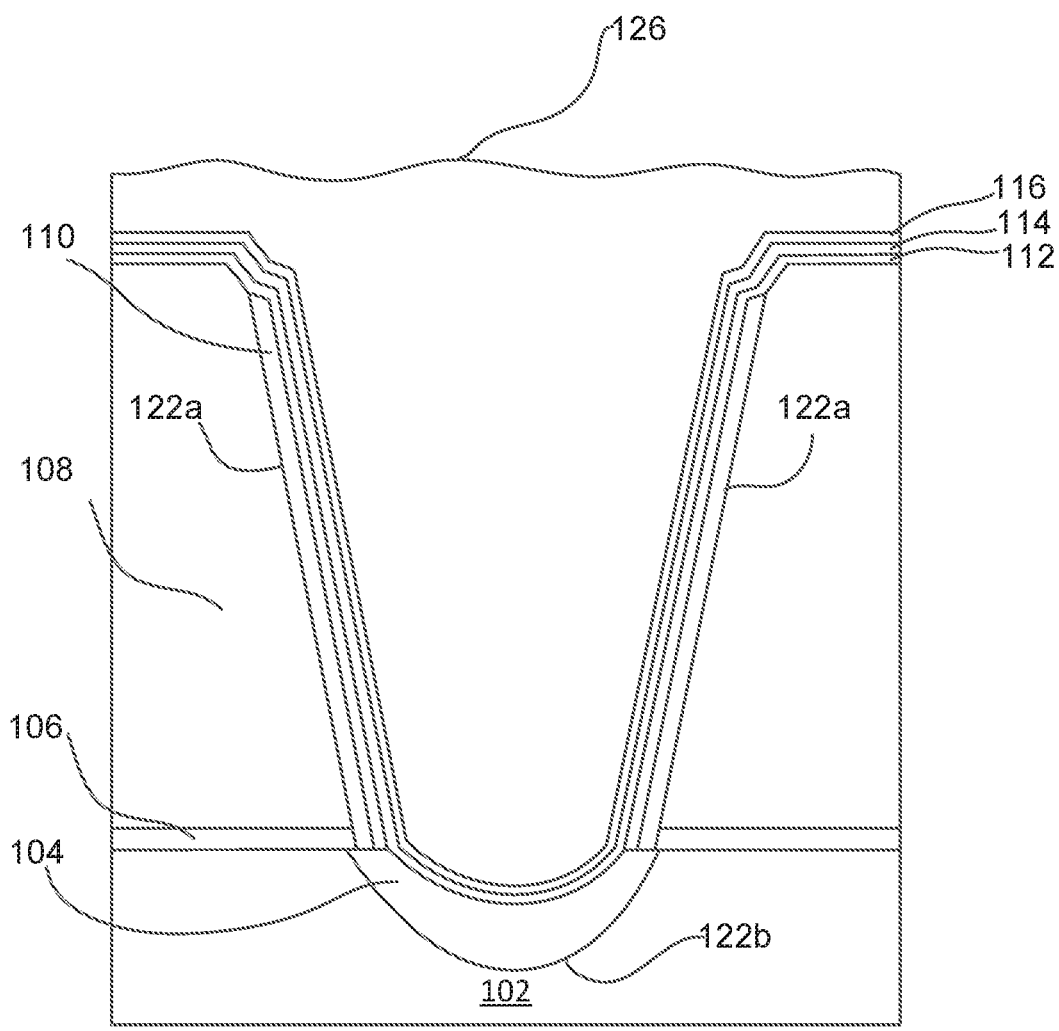

In FIG. 11, a metal layer 126 is deposited to fully fill in the opening or contact region 122. The metal layer 126 may include cobalt (Co), tungsten (W), ruthenium (Ru), aluminum (Al), copper (Cu), or other suitable conductors, and be deposited by a suitable deposition process, such as chemical vapor deposition (CVD), physical vapor deposition (PVD), atomic layer deposition (ALD), sputtering, e-beam evaporation, or any combination thereof. Alternatively, the metal layer 126 may include copper (Cu), copper magnesium (CuMn), copper aluminum (CuAl), and the like, and an electro-chemical plating (ECP) process may be applied. In some embodiments, a conductive seed layer (not shown) is formed before the metal layer 126. The conductive seed layer can contain a pure metal, such as cobalt (Co), or copper (Cu). In some embodiments, the conductive seed layer at least contains the main metal element, such as Co or Cu, as contained in the metal layer 126, or the conductive seed layer is copper-containing layer, such as CuAl, CuMn, or the like. The conductive seed layer can be formed by using physical vapor deposition (PVD) or other well-known deposition techniques. The conductive seed layer can have a thickness of, for example, about 100 Å to about 450 Å.

Figure 12:
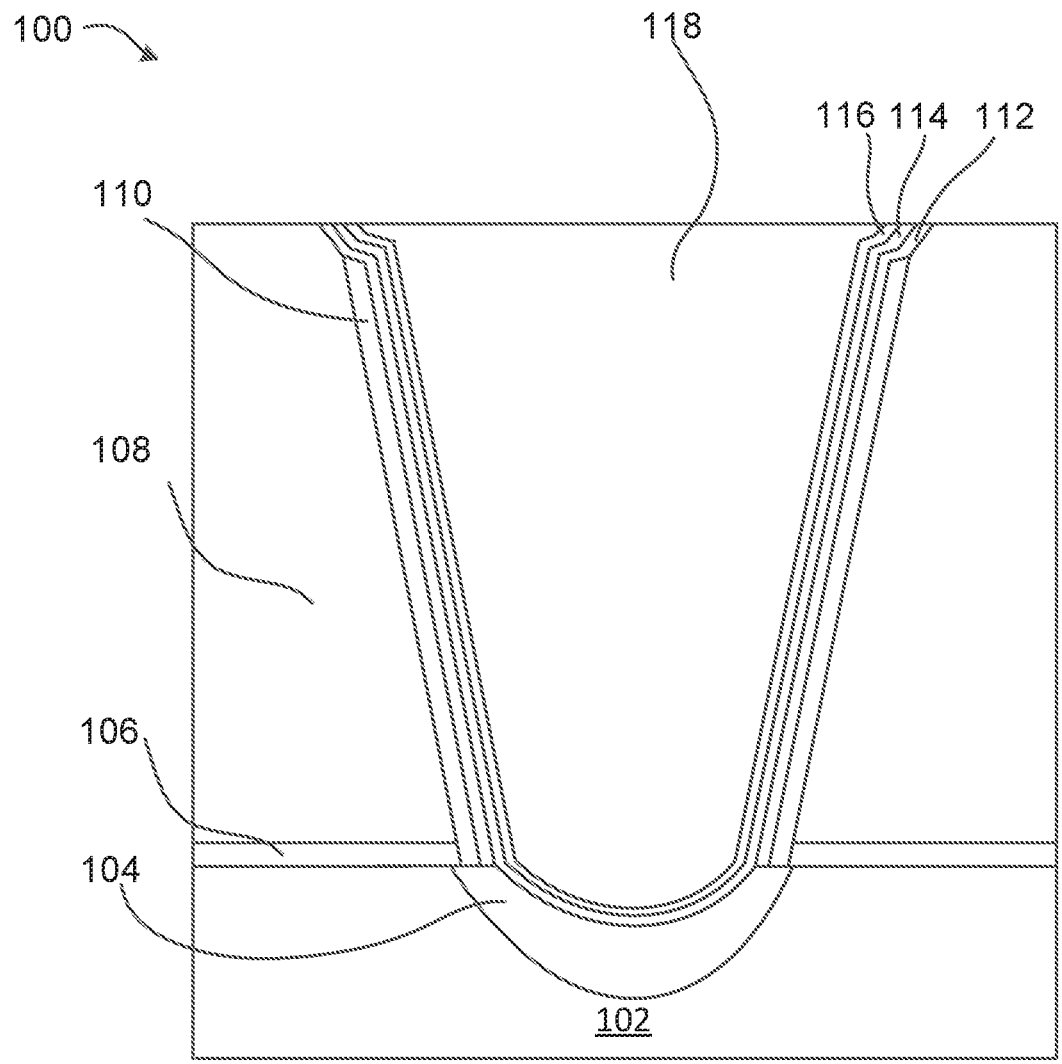

In FIG. 12, the metal layer 126 may be recessed, as well as the conductive layer 112, the conductive layer 114, and the conductive barrier layer 116 over the dielectric layer 108, to provide a planar topography. A chemical mechanical polishing (CMP) process can be performed to remove any excessive metal layer 126, conductive layer 112, conductive layer 114, and conductive barrier layer 116 over the dielectric layer 108. Alternatively, an etching back process may be applied to remove any excessive metal layer 126, conductive layer 112, conductive layer 114, and the conductive barrier layer 116 over the dielectric layer 108. The remaining metal layer 126 in the opening or contact region 122 forms a conductive core 118. After the metal recessing, a final contact plug 100 is formed which is identical to the contact plug 100 illustrated in FIG. 1A. As shown in FIG. 12, top surfaces of the conductive core 118, conductive barrier layer 116, conductive layer 114 and conductive blocking layer 112 can be level with, while a top surface of the dielectric barrier layer 110 is lower than top surfaces of 118, 116, 114 and 112.

Figure 13:
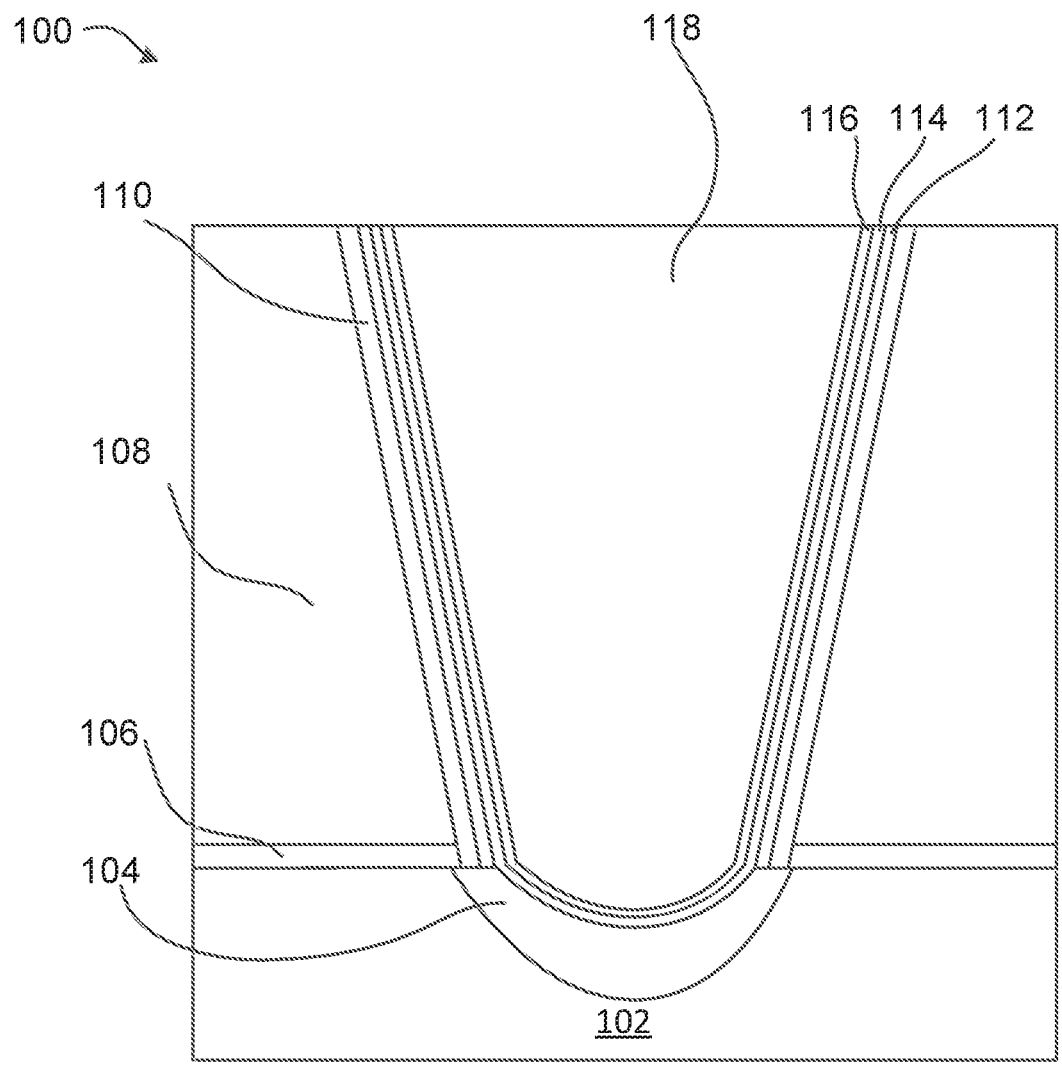

FIG. 13 shows another example of contact plug 100 which is identical to the contact plug illustrated in FIG. 1B. As shown in FIG. 13, after the metal recessing, top surfaces of the dielectric barrier layer 110, conductive core 118, conductive barrier layer 116, conductive layer 114 and conductive blocking layer 112 can all be level with. The example shown in FIG. 13 can be implemented by adjusting the metal recessing process. For example, if a CMP process is applied to recess the metal, the CMP process can be adjusted to polish deeper to make the top surface of the dielectric barrier layer 110 be level with top surfaces of 118, 116, 114 and 112.

Figure 14:
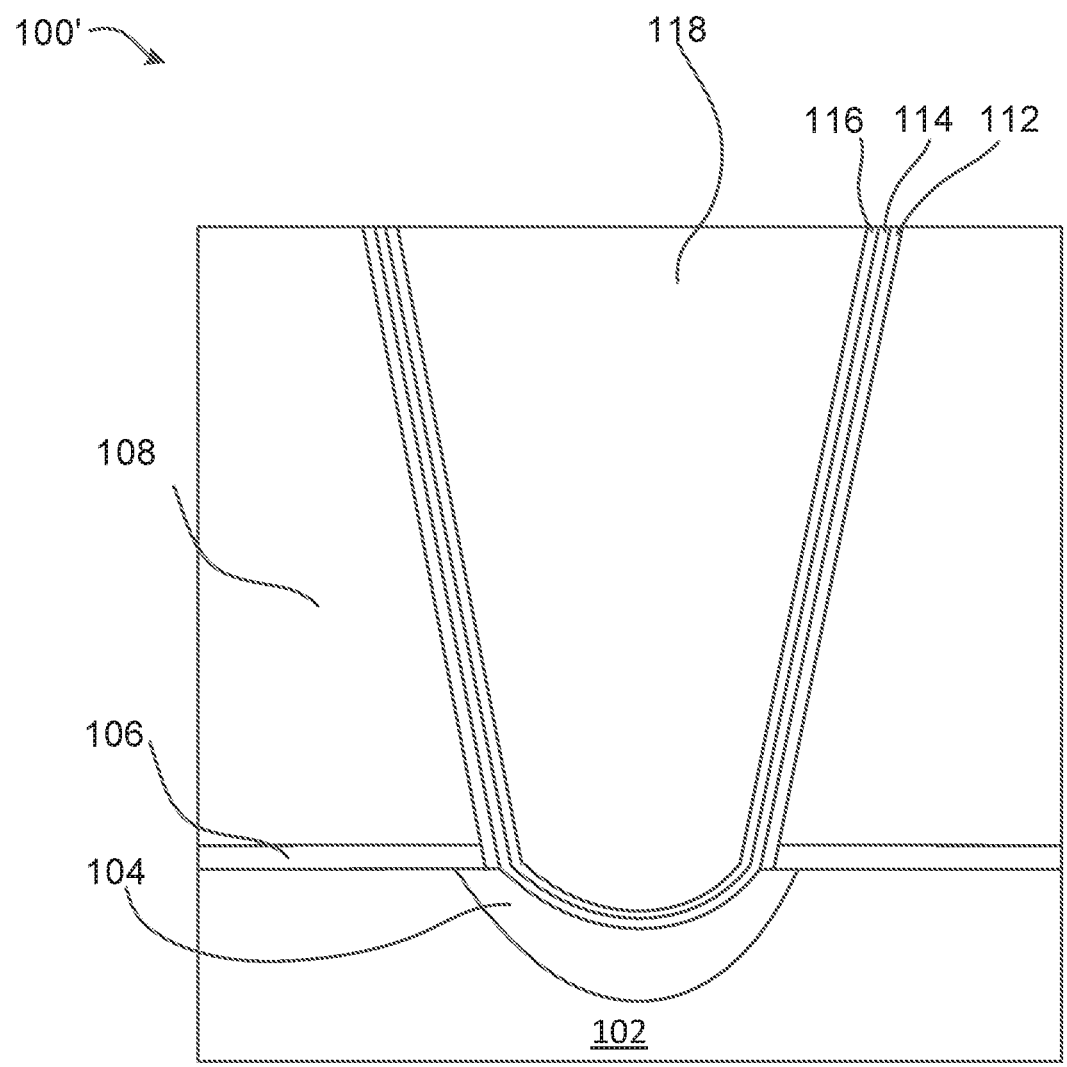
FIG. 14 illustrates an exemplary schematic cross-sectional view of an alternative contact plug in accordance with some embodiments.

Referring now to FIG. 14, an alternative contact plug 100' is described. Compared to the contact plug 100 illustrated in FIG. 1B, the difference is that the alternative contact plug 100' has no dielectric barrier layer 110 along the side and bottom portions of the opening or contact region. In order to form the contact plug 100', the process will still begin with patterning an opening or contact region 122 in a dielectric stack to expose an underlying substrate 102 (FIG. 2 and FIG. 3). The next step is to form a conductive blocking layer 112 on the side portions and the bottom portion of the opening or contact region 122 (FIG. 6 without the dielectric layer 110). Then the process flow proceeds to forming the conductive layer 114 (FIG. 7 without the dielectric layer 110) and performing the first annealing process to form the silicide region 104' (FIG. 8 without the dielectric layer 110). The followed step can be coating the conductive barrier layer 116 (FIG. 9 without the dielectric layer 110) and performing the second annealing process to form silicide 104 (FIG. 10 without the dielectric layer 110), and the whole process flow ends in forming a conductive core 118 in the opening or contact region over the conductive barrier layer 116 (FIGS. 11 and 13, no dielectric barrier layer 110).

Figure 15:
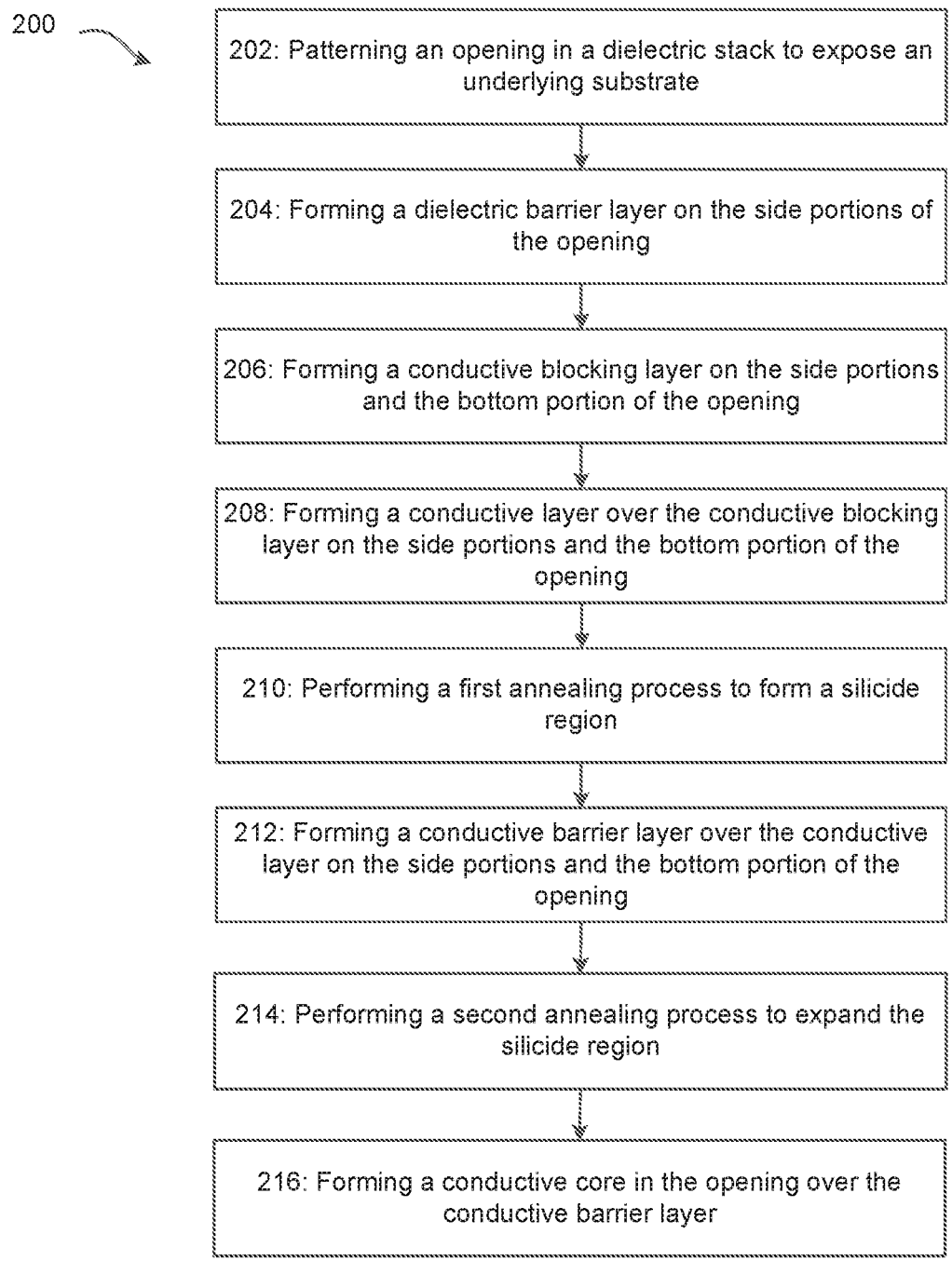
FIG. 15 illustrates an exemplary process flow for manufacturing a contact plug in accordance with some embodiments.

FIG. 15 illustrates an exemplary process flow 200 for forming a contact plug 100 in accordance with some embodiments. The process begins in step 202, where an opening or a contact region can be patterned in a dielectric stack. The contact region can extend into the substrate with a varying depth where the depth at the end portions is generally larger than the depth at the middle portion. The dielectric stack can include dielectric layers 106 and 108 that are formed on a substrate 102. The opening or contact region 122 may expose the underlying substrate region 102 for electrical connection, such as a source/drain region, a gate electrode, or other components in the semiconductor device. The step 202 can be illustrated in FIGS. 2 and 3.

Next, in step 204, a dielectric barrier layer may be deposited on side and bottom portions of the opening or contact region. Subsequently, the dielectric barrier layer may receive an etching process, such as a blanket dry etching or a dry etching with a photoresist mask. During the dry etching, the bottom portion of the dielectric barrier layer can be removed. Further, a top portion of the dielectric barrier layer over the dielectric layer and a top portion of the dielectric stack can be removed as well. As a result of the etching process, the dielectric barrier layer only remains along the side portions of the opening or contact region, and the dielectric barrier layer is in direct contact with the dielectric stack (having dielectric layers 106 and 108) and the substrate. An example of the dielectric barrier layer 100 is shown in FIG. 5. As shown in FIG. 5, the top surface of the dielectric layer is lower than the top surface of the dielectric stack according to the etching process. The dielectric barrier layer 100 can be introduced in current disclosure to effectively prevent the electrical short and the reliability failure as the semiconductor devices move to advanced technology nodes, such as 10 nm or beyond.

The process flow 200 can then proceeds to step 206 where a thin conductive blocking layer is deposited in the opening or contact region, as well as over the exposed substrate and the dielectric barrier layer. For example, the step 206 can be illustrated in FIG. 6. The conductive blocking layer is thin, for example less than 10 Å, and formed at a low temperature, for example less than 30° C. The conductive blocking layer can serve as an effective blocking layer to prevent the reaction between the dielectric barrier layer/dielectric stack (having layers 106 and 108) and the subsequent conductive layer. Without the conductive blocking layer, the subsequently formed conductive layer 114 would be in direct contact with the dielectric barrier layer 110 or the dielectric stack having dielectric layers of 106 and 108. However, during formation of the conductive layer 114, a reaction may happen between the dielectric barrier layer 110/dielectric stack (having layers 106 and 108) and the forming gases that form the conductive layer 114. A by-product of the reaction can remain on the side portions and the bottom portion of the opening or contact region. As a result, a spacing to form the conductive core 118 can be reduced. The consequence of the reduced spacing can be a voided or incomplete conductive core 118, which may cause both electrical failure and reliability failure. By forming thin and low-temperature formed conductive blocking layer 112 in the opening or contact region prior to the formation of the conductive layer 114, the reaction between the dielectric barrier layer 110/ dielectric stack (having layers 106 and 108) and the conductive layer 114 can be reduced or prevented. In particular, as the conductive blocking layer 112 can be formed at low temperature, such as a temperature less than 30° C., such low temperature restrains the reaction between the conductive blocking layer 112 and the dielectric barrier layer 110 or between conductive blocking layer 112 and the dielectric stack (having layers 106 and 108). In addition, a very thin structure of the conductive blocking layer 112 provides sufficient spacing for the formation of a void-free conductive core 118.

Subsequently, the process flow 200 proceeds to step 208 where a conductive layer can be formed in the opening or contact region. The conductive layer is formed over the conductive blocking layer along the side portions and the bottom portion of the opening or contact region. The conductive layer can help the formation of the subsequent silicide region 104 and reduce the resistance between the contact plug 100 and the substrate 102. The step 208 can be illustrated in FIG. 7.

The process then proceeds to step 210 where a first annealing process can be performed to form a silicide region 104'. Silicide 104' may be formed by diffusing the conductive material of conductive blocking layer 112 into upper portions of substrate 102. After annealing, bottom portion of the conductive blocking layer 112 that is in direct contact with the substrate may be diffused into substrate 102 while side portions of the conductive blocking layer 112 over dielectric barrier layer 110 and dielectric stack may remain. In addition, the conductive layer 114 can still remain. The step 210 can be illustrated in FIG. 8.

In step 212, a conductive barrier layer is formed over the conductive layer on the side portions and the bottom portion of the opening or contact region. For example, the step 212 can be shown in FIG. 9. The conductive barrier layer can function as an effective adhesion layer and a barrier layer to the subsequently formed conductive core. The conductive barrier layer promotes the adhesion of the conductive core to the surrounding layers and prevents the reflow/diffusion of the conductive core to the surrounding layers in the contact opening. It should be noted that the total thickness of the conductive blocking layer, the conductive layer, and the conductive barrier layer on the side portions of the contact region can be less than 20 Å in order to provide spacing for the formation of a conductive core 118 in the opening or contact region.

The process flow 200 then proceeds to step 214 where a second annealing process can be used to expand the silicide region formed during the first annealing process in the substrate beneath the bottom portion of the opening or contact region. Step 214 can be illustrated in FIG. 10. In step 214, the silicide region can be expanded further into the substrate by diffusing conductive material from the conductive blocking layer and the conductive layer into upper portion of substrate. The process flow 200 then proceeds to step 216.

In step 216, where a metal layer can be deposited to fill in the opening or contact region and a surface planarization process, such as CMP, can be performed to remove any excessive metal layer, conductive blocking layer, conductive layer, and conductive barrier layer over the dielectric stack. After the surface planarization, a conductive core is formed and the contact plug is complete. Step 216 can be illustrated in FIGS. 11, 12 and 13. Depending on the recessing process, in FIG. 12, the top surface of the dielectric barrier layer is lower in the top surface of the dielectric stack, and in FIG. 13, the top surface of the dielectric barrier layer is level with the top surface of the dielectric stack.

It should be noted herein that the alternative device structure 100' illustrated in FIG. 12 can also be manufactured through the process flow 200. In order to produce contact plug 100', the process flow 200 can start with step 202, and then skip step 204. After the skip of the step 204, process flow 200 proceeds to steps 206, 208, 210, 212, 214 and ends in step 216.

It should be noted that additional steps can be provided before, during, and after the exemplary method 200, and some of the steps described can be replaced, eliminated, or moved around for additional embodiments of the method 200. In subsequent process steps, various additional interconnect structures (e.g., metallization layers having conductive lines and/or vias) may be formed over the dielectric layer 108. Such interconnect structure electrically connect the contact plug 100 with other contact plugs and/or active devices to form functional circuits. Additional device features such as passivation layers, input/output structures, and the like may also be formed.

With respect to the description provided herein, the present disclosure offers methods and structures for forming a contact plug which avoids many of the pitfalls of conventional processing techniques, as the semiconductor devices shrinks to advanced technology node, such as 10 nm and beyond. The contact plug described in the present disclosure can meet both the conductivity and reliability requirements in advanced technology nodes. Embodiments of the present disclosure advantageously provide a conductive blocking layer which is thin, for example less than 10 Å, and formed at a low temperature, for example less than 30° C. The disclosed conductive blocking layer can effectively prevent the reaction between the dielectric barrier layer and the subsequently formed conductive layer, or prevent the reaction between the dielectric stack and the subsequently formed conductive layer. Without the conductive blocking layer, the conductive layer is in direct contact with the dielectric barrier layer or the dielectric stack. However, during formation of the conductive layer, a reaction can happen between the dielectric barrier layer/dielectric stack and the forming gases that form the conductive layer. A by-product of the reaction can remain on the side portions and the bottom portion of the opening. As a result, a spacing to form the conductive core can be reduced. The consequence of the reduced spacing can be a voided or incomplete conductive core, which may cause both electrical failure and reliability failure. By forming thin and low-temperature conductive blocking layer in the opening prior to the formation of the conductive layer, the reaction between the dielectric barrier layer/dielectric stack and the conductive layer can be reduced or prevented. In particular, as the conductive blocking layer can be formed at low temperature, such as a temperature less than 30° C., such low temperature restrains the reaction between the conductive blocking layer and the dielectric barrier layer or between conductive blocking layer and the dielectric stack. In addition, a thin structure of the conductive blocking layer provides sufficient spacing for the formation of a void-free conductive core. In the current disclosure, with the formation of a thin and low-temperature formed conductive blocking layer, a void-free conductive core can be formed in the advanced technology nodes, such as 10 nm or beyond. Further, in current disclosure, a dielectric barrier layer is also advantageously provided which can act as an effective barrier layer to prevent the electrical short from the adjacent contacts or components, and hence can improve both the electrical and reliability properties.

As described above, aspects of the disclosure can provide a method for forming a semiconductor contact plug that includes forming a dielectric stack over a substrate and patterning a contact region in the dielectric stack, the contact region having side portions and a bottom portion that exposes the substrate. The method can further include forming a dielectric barrier layer in the contact region to cover the side portions. Subsequently, a conductive blocking layer can be formed in the contact region by a low temperature process to cover the dielectric barrier layer, the dielectric stack, and the bottom portion of the contact region. A conductive layer can be then formed over the conductive blocking layer in the contact region and a conductive barrier layer can be formed over the conductive layer in the contact region. The method can further include forming a silicide region in the substrate beneath the conductive layer.

According to another aspect of the disclosure, a semiconductor device is described that includes a dielectric stack formed on a substrate having an contact region extending through the dielectric stack to the substrate, the contact region having side portions and a bottom portion. The device includes a dielectric barrier layer that is formed on the side portions of contact region. The device can also include a conductive blocking layer formed along the side portions of the contact region over the dielectric barrier layer and the dielectric stack, and a conductive layer formed along the side portions and bottom portion of the contact region over the conductive blocking layer in the contact region. The device further includes a conductive barrier layer formed on the conductive layer in the contact region, a conduct core over the conductive barrier layer in the contact region, and a silicide region located in the substrate beneath the conductive layer.

As described in another aspect of the disclosure, a method for forming a semiconductor contact plug can include depositing a dielectric stack over a substrate and forming a contact region in the dielectric stack, the contact region having side portions and a bottom portion that exposes the substrate. The method can include depositing a first metal layer in the contact region by a low temperature process to cover the side portions and bottom portion of the contact region, and depositing a second metal layer over the first metal layer in the contact region. The method can further include depositing a conductive barrier layer over the second metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor contact plug, the method comprising:
   forming a dielectric stack over a substrate and patterning a contact region in the dielectric stack, the contact region extending into the substrate and having side portions and a bottom portion that exposes the substrate;
   forming a dielectric barrier layer in the contact region to cover the side portions of the contact region;
   removing an upper portion of the dielectric barrier layer to expose an upper sidewall of the dielectric stack;
   forming a conductive blocking layer to cover the dielectric barrier layer, the dielectric stack, and the bottom portion of the contact region, wherein the conductive blocking layer has a lateral surface lower than a top surface of the dielectric stack and higher than a topmost surface of the dielectric barrier layer;
   forming a conductive layer over the conductive blocking layer;
   forming a conductive barrier layer over the conductive layer;
   performing a first annealing process to form a silicide region in the substrate beneath the conductive layer; and
   performing a second annealing process by diffusing a portion of the conductive layer into the substrate to increase a thickness of the silicide region in the substrate.

2. The method of claim 1, wherein the first annealing process is performed after forming the conductive layer and the second annealing process is performed after forming the conductive barrier layer.

3. The method of claim 1, wherein forming the conductive blocking layer further comprises forming the conductive blocking layer with a thickness of less than 10 Å.

4. The method of claim 1, comprising forming the conductive layer over the conductive blocking layer, and forming the conductive barrier layer over the conductive layer in the contact region with a total thickness of the three layers along the side portions of the contact region being less than 20 Å.

5. The method of claim 1, wherein the conductive blocking layer that is formed in the contact region by a low temperature process comprises at least one of titanium (Ti), nickel (Ni), tungsten (W), cobalt (Co), or platinum (Pt).

6. The method of claim 1, wherein the dielectric barrier layer that is formed in the contact region to cover the side portions and the bottom portion comprises at least one of SiN, SiCN, SiC, SiON, and $AlO_x$.

7. The method of claim 1, further comprising forming a conductive core in the contact region that is in contact with the conductive barrier layer.

8. The method of claim 1, wherein the conductive blocking layer and the conductive layer are made of the same material.

9. A semiconductor device, comprising:
   a dielectric stack formed on a substrate;
   a contact region formed within the dielectric stack and extending into the substrate, the contact region having side portions and a bottom portion;
   a dielectric barrier layer formed on the side portions of the contact region;
   a conductive blocking layer formed along the side portions of the contact region over the dielectric barrier layer and the dielectric stack, wherein a topmost surface of the dielectric barrier layer is lower than a topmost surface of the conductive blocking layer, and the topmost surface of the conductive blocking layer is substantially level with a top surface of the dielectric stack, and a bottommost surface of the dielectric barrier layer is substantially level with a bottommost surface of the conductive blocking layer, and wherein the conductive blocking layer has a lateral surface lower than the top surface of the dielectric stack and higher than the topmost surface of the dielectric barrier layer;
   a conductive layer formed along the side portions and bottom portion of the contact region over the conductive blocking layer in the contact region;
   a conductive barrier layer formed on the conductive layer in the contact region, wherein a bottom surface of the conductive blocking layer is substantially level with a top surface of the substrate, and the conductive layer and the conductive barrier layer extend into the substrate;

a conduct core over the conductive barrier layer in the contact region; and a silicide region located in the substrate beneath the conductive layer.

10. The semiconductor device of claim 9, wherein the conductive blocking layer has a thickness of less than 10 Å.

11. The semiconductor device of claim 9, wherein the conductive blocking layer is at least one of titanium (Ti), nickel (Ni), tungsten (W), cobalt (Co), or platinum (Pt).

12. The semiconductor device of claim 9, wherein the conductive layer is formed over the conductive blocking layer, and the conductive barrier layer is arranged over the conductive layer, and the total thickness of three layers along the side portions of the contact region are less than 20 Å.

13. The semiconductor device of claim 9, wherein the dielectric barrier layer formed on the side portions of contact region is at least one of SiN, SiCN, SiC, SiON, and $AlO_x$.

14. The semiconductor device of claim 9, wherein the conductive layer formed over the conductive blocking layer in the contact region is at least one of titanium (Ti), nickel (Ni), tungsten (W), cobalt (Co), or platinum (Pt).

15. The method of claim 9, wherein the conductive blocking layer and the conductive layer are made of the same material.

16. A method for forming a semiconductor contact plug, the method comprising:

depositing a dielectric stack over a substrate;

forming a contact region in the dielectric stack, the contact region extending into the substrate and having side portions and a bottom portion that exposes the substrate;

forming a dielectric barrier layer along the side portions of the contact region;

depositing a first metal layer in the contact region over the dielectric barrier layer and the dielectric stack to cover the side portions and bottom portion of the contact region, wherein the first metal layer has a lateral surface lower than a top surface of the dielectric stack and higher than a topmost surface of the dielectric barrier layer;

depositing a second metal layer over the first metal layer;

depositing a conductive barrier layer over the second metal layer; and performing a first annealing process to form a silicide region in the substrate; and performing a second annealing process by diffusing a portion of the second metal layer into the substrate to increase a thickness of the silicide region in the substrate, wherein the first annealing process is performed before the formation of the conductive barrier layer, and the second annealing process is performed after the formation of the conductive barrier layer.

17. The method of claim 16, wherein the first annealing process is performed after the formation of the second metal layer.

18. The method of claim 16, wherein depositing the first metal layer further comprises depositing the first metal layer at a temperature that is below 30° C. and with a thickness of less than 10 Å.

19. The method of claim 16, further comprising forming a dielectric barrier layer along the side portions of the contact region, wherein the first metal layer is formed over the dielectric barrier layer and the dielectric stack.

20. The method of claim 16, further comprising depositing the second metal layer over the first metal layer, and depositing the conductive barrier layer over the second metal layer in the contact region with a total thickness of three layers along the side portions of the contact region being less than 20 Å.

* * * * *